US008822877B2

United States Patent
Qin

(10) Patent No.: US 8,822,877 B2
(45) Date of Patent: Sep. 2, 2014

(54) RAPID THERMAL PROCESSING SYSTEMS AND METHODS FOR TREATING MICROELECTRONIC SUBSTRATES

(71) Applicant: Micron Technology, Inc., Boise, ID (US)

(72) Inventor: Shu Qin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/868,886

(22) Filed: Apr. 23, 2013

(65) Prior Publication Data

US 2013/0233834 A1  Sep. 12, 2013

Related U.S. Application Data

(62) Division of application No. 12/429,109, filed on Apr. 23, 2009, now Pat. No. 8,426,763.

(51) Int. Cl.
*B23K 10/00* (2006.01)
(52) U.S. Cl.
USPC .............. 219/121.44; 219/121.43; 219/121.4; 118/724; 438/715
(58) Field of Classification Search
CPC ...................................................... B23K 10/00
USPC ............... 219/121.44, 121.4, 121.48, 121.43; 118/723 R, 724, 725; 438/550, 715, 438/798
See application file for complete search history.

(56) References Cited

U.S. PATENT DOCUMENTS

| 4,844,775 | A | 7/1989 | Keeble |
| 5,593,511 | A * | 1/1997 | Foster et al. ................... 148/238 |
| 6,291,343 | B1 | 9/2001 | Tseng et al. |
| 6,303,524 | B1 | 10/2001 | Sharangpani et al. |
| 6,514,870 | B2 | 2/2003 | Rossman |
| 6,524,428 | B2 * | 2/2003 | Tamura et al. ............. 156/345.1 |
| 6,939,435 | B1 | 9/2005 | Tanaka et al. |
| 7,109,114 | B2 | 9/2006 | Chen et al. |
| 7,132,373 | B2 | 11/2006 | Fukuhisa et al. |
| 7,312,148 | B2 | 12/2007 | Ramaswamy et al. |
| 7,323,401 | B2 | 1/2008 | Ramaswamy et al. |
| 7,371,623 | B2 | 5/2008 | Yamazaki et al. |
| 7,465,478 | B2 | 12/2008 | Collins et al. |
| 7,998,841 | B2 | 8/2011 | Azuma et al. |
| 2010/0273277 | A1 | 10/2010 | Qin |

OTHER PUBLICATIONS

Borland, J., "Comparison of B, BF2 & B18H22 for Extension and BF2, B18H22 & In HALO Implantation for 32nm Node using various Diffusion-less Annealing Techniques", The 17th International Conference on Ion Implantation Technology (IIT2008), Monterey, CA, USA, Jun. 8-13, 2008, AIP Conference Proceedings, vol. 1066, pp. 63-66.

(Continued)

*Primary Examiner* — Mark Paschall
(74) *Attorney, Agent, or Firm* — Perkins Coie LLP

(57) ABSTRACT

Rapid thermal processing systems and associated methods are disclosed herein. In one embodiment, a method for heating a microelectronic substrate include generating a plasma, applying the generated plasma to a surface of the microelectronic substrate, and raising a temperature of the microelectronic substrate with the generated plasma applied to the surface of the microelectronic substrate. The method further includes continuing to apply the generated plasma until the microelectronic substrate reaches a desired temperature.

15 Claims, 5 Drawing Sheets

(56) References Cited

OTHER PUBLICATIONS

Chu, P.K. et al., "Plasma Immersion Ion Implantation—A Fledgling Technique for Semiconductor Processing", Materials Science & Engineering Reports, vol. R17, Nos. 6-7, pp. 207-280, Nov. 1996.
Current, M.I. et al., Plasma Immersion Ion Implantation: Applications for Semiconductor Materials and Coatings, Ion Implantation Science and Technology, Zeigler, J.F. (ed.), pp. 133-171, 2000 Ion Implantation Technology, Co., ISBN 0-9654207-0-1.
Fiory, A.T., "Recent Development in Rapid Thermal Processing", Journal of Electronic Materials, vol. 31, No. 10, pp. 981-987, 2002.
Gable, K.A. et al., "Electrical and Structural Characterization of Boron Implanted Silicon Following Laser Thermal Processing", Mat. Res. Soc. Symp. Proc. vol. 717, pp. C1.10.1-C1.10.6, 2002.
Kalra, P. et al., "USJ Process Challenges for Sub-45nm CMOS", The 17th International Conference on Ion Implantation Technology (IIT2008), Monterey, CA, USA, Jun. 8-13, 2008, AIP Conference Proceedings, vol. 1066, pp. 55-62.
Lindsay, R. et al., "A Comparison of Spike, Flash, SPER and Laser Annealing for 45nm CMOS", 2003 MRS Spring Meeting Apr. 21-25, 2003, San Francisco.

* cited by examiner

RAPID THERMAL PROCESSING SYSTEMS AND METHODS FOR TREATING MICROELECTRONIC SUBSTRATES

CROSS-REFERENCE TO RELATED APPLICATION

This application is a divisional of U.S. application Ser. No. 12/429,109 filed Apr. 23, 2009, now U.S. Pat. No. 8,426,763, which is incorporated herein by reference in its entirety.

TECHNICAL FIELD

The present disclosure is related to rapid thermal processing systems and methods for treating microelectronic substrates.

BACKGROUND

Rapid thermal processing (RTP) generally refers to processes in which semiconductor substrates are heated to high temperatures (e.g., typically 1,000° C.) in a short period of time (e.g., 5 seconds). RTP is typically used in doping/annealing (e.g., dopant activation and wafer damage recovery), rapid thermal oxidation (e.g., gate oxide formation), contact formation (e.g., metal silicide formation), shallow trench isolation reflowing, and/or other stages of semiconductor manufacturing.

Current commercial RTP systems are typically lamp-based or hot wall-based. Lamp-based RTP systems include an array of tungsten-halogen lamps to heat a substrate predominately via radiation. The hot wall-based RTP systems typically include a resistive heating array, and the heating mechanism is also predominately radiation at high temperature ranges (e.g., greater than about 800° C.). Such radiation-based techniques have low energy transfer efficiencies because, among other things, the heat transfer is emissivity-dependent (e.g., dependent on substrate temperature, substrate material, surface conditions, etc.). As a result, ramp-up rates for such RTP systems are relatively low because a substrate may not efficiently absorb the supplied radiation energy. Accordingly, lamp-based or hot wall-based RTP systems may be inadequate for forming junctions with a small junction depth (e.g., 20-35 nm) and an adequate sheet resistance for source/drain extension as feature dimensions of ULSI devices decrease to around 0.1 µm.

In the last decade, flash lamp-based and pulsed laser-based RTP techniques have been under development. These techniques use pulses of high optical energy to either selectively raise a surface temperature or briefly melt the surface of a semiconductor substrate. Upon termination of an optical pulse, the surface of the substrate rapidly cools via thermal diffusion into the bulk of the substrate material. These techniques, however, are still radiation-based. Thus, the energy transfer efficiency is still low. Also, these techniques involve rapidly quenching the semiconductor substrate after each optical pulse, which can lead to lattice defects and dopant metastability issues. Consequently, junction leakage and dopant redistribution during subsequent thermal processing stages may result. Accordingly, several improvements to the current RTP systems and techniques may be desirable.

DETAILED DESCRIPTION

Various embodiments of RTP systems and methods for treating microelectronic substrates are described below. The term "microelectronic substrate" is used throughout to include substrates upon which and/or in which microelectronic devices, micromechanical devices, data storage elements, read/write components, and other features are fabricated. Microelectronic substrates can include one or more conductive and/or nonconductive layers (e.g., metallic, semiconductive, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a micro-electromechanical system, etc.). The term "ramp-up" generally refers to increasing a temperature of an object (e.g., a microelectronic substrate) from an initial temperature (e.g., room temperature) to a desired temperature (e.g., about 1000° C.). The term "ramp-down" generally refers to decreasing a temperature of an object from an initial temperature (e.g., about 1000° C.) to a desired temperature (e.g., room temperature). The term "room temperature" generally refers to a temperature of about 20° C. or another suitable ambient temperature of a room in which the RTP system is located. A person skilled in the relevant art will also understand that the systems and/or methods disclosed herein may have additional embodiments and that the systems and methods disclosed herein may be practiced without several details of the embodiments described below with reference to FIGS. 1-6.

Figure 1:
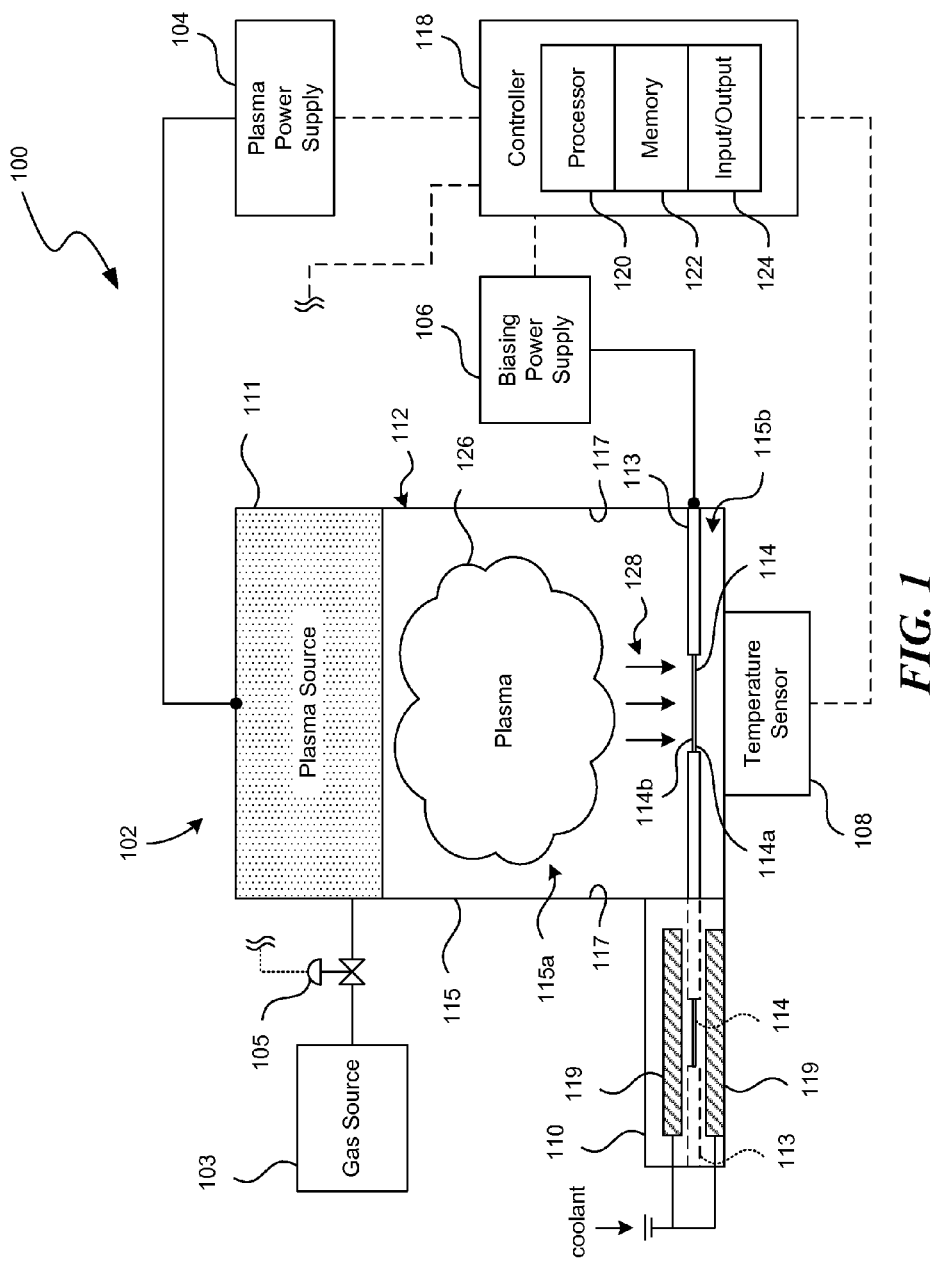
FIG. 1 is a schematic view of a plasma-immersion type RTP system in accordance with an embodiment of the disclosure.

FIG. 1 is a schematic view of a plasma-immersion type RTP system 100 in accordance with an embodiment of the technology. As shown in FIG. 1, the RTP system 100 includes a processing station 102, a plasma gas source 103, a plasma power supply 104, a biasing power supply 106, and a controller 118 operatively coupled to one another. The plasma gas source 103 can be coupled to the processing station 102 by a control valve 105 and can include a container holding argon, oxygen, nitrogen, xenon, helium, and/or other suitable plasma gases. The plasma power supply 104 can include an AC power supply and/or other types of power supply suitable for energizing a plasma source. The biasing power supply 106 can include a continuous DC power supply or a pulsed DC power supply. In other embodiments, the RTP system 100 can also include a vacuum source (e.g., a vacuum pump), power conditioners (e.g., rectifiers, filters, etc.), pressure sensors, and/or other suitable mechanical/electrical components.

The processing station 102 can include a plasma source 111, a plasma chamber 112, and a temperature sensor 108 operatively coupled to one another. The plasma source 111 can be operatively coupled to the plasma power supply 104 and can include an inductively coupled plasma source, a capacitively coupled plasma source, a microwave plasma source, an electron cyclotron resonance plasma source, a helicon source, and/or other suitable types of plasma sources. The plasma source 111 shown in FIG. 1 is integrated with the plasma chamber 112, but in other embodiments the plasma source may be spaced apart from the plasma chamber 112 (e.g., a remote plasma source). In such an embodiment, the RTP system 100 may include a conduit (not shown) for transporting a plasma generated by the remote plasma source to the plasma chamber 112.

The plasma chamber 112 can include a housing 115 enclosing a substrate support 113. The housing 115 can be constructed from quartz, a polymeric material, and/or other suitable materials. The substrate support 113 can be electrically coupled to the biasing power supply 106. In the illustrated embodiment, the substrate support 113 includes a ring-shaped structure extending from a side wall 117 of the housing 115. The substrate support 113 can hold a microelectronic substrate 114 with its active surface 114a (e.g., containing integrated circuits, electrical contacts, etc.) facing away from the plasma source 111 and its back surface 114b facing the plasma source 111. In certain embodiments, the substrate support 113 and the microelectronic substrate 114 can sealably divide the interior space of the housing 115 into a first portion 115a and a second portion 115b. In other embodiments, the substrate support 113 can include other structures (e.g., a mechanical chuck, a vacuum chuck, etc.) that may or may not completely seal the second portion 115b from the first portion 115a.

As shown in FIG. 1, the temperature sensor 108 includes a noncontacting type temperature sensor (e.g., a pyrometer) positioned outside of the housing 115. In other embodiments, the temperature sensor 108 can also include a contacting type temperature sensor (e.g., a thermocouple, a resistance temperature detector, etc.) that is in direct contact with the substrate support 113 and/or the microelectronic substrate 114. In further embodiments, the temperature sensor 108 may be integrated with the substrate support 113. The temperature sensor 108, however, is optional and may be omitted from the RTP system 100.

In the illustrated embodiment, the RTP system 100 can optionally include a cooling chamber 110 coupled to the processing station 102. The cooling chamber 110 can include at least one cooling chuck 119 (two are shown for illustration purposes) configured to cool the microelectronic substrate 114 after being heated in the plasma chamber 112. In other embodiments, the cooling chamber 110 may include a coolant nozzle for providing a coolant (e.g., dry air, nitrogen, argon, etc.) to the microelectronic substrate 114 and/or other suitable arrangements for cooling the microelectronic substrate 114. In further embodiments, the cooling chamber 110 may be omitted.

The controller 118 can include a processor 120 coupled to a memory 122 and an input/output component 124. The processor 120 can include a microprocessor, a field-programmable gate array, and/or other suitable logic processing devices. The memory 122 can include volatile and/or non-volatile media (e.g., ROM, RAM, magnetic disk storage media, optical storage media, flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the RTP system 100 via a communication link (e.g., a USB link, an Ethernet link, a Bluetooth link, etc.). In other embodiments, the controller 118 can include a network server operatively coupled to the other components of the RTP system 100 via a network connection (e.g., an internet connection, an intranet connection, etc.) In further embodiments, the controller 118 can include a process logic controller, a distributed control system, and/or other suitable computing frameworks.

In operation, the processing station 102 can receive the microelectronic substrate 114. In certain embodiments, the microelectronic substrate 114 can be loaded onto the substrate support 113 with its back surface 114b facing the plasma source 111. In other embodiments, the processing station 102 can receive the microelectronic substrate 114 in other suitable arrangements. The processing station 102 can then be evacuated by drawing a vacuum in the plasma chamber 112 via a vacuum source (not shown) until a suitable vacuum (e.g., about 0 Torr to about 50 mTorr) is achieved at least in the plasma chamber 112.

After the suitable pressure is achieved, the controller 118 can output a signal to open the control valve 105. The plasma gas source 103 then supplies a plasma gas (e.g., argon) to the plasma chamber 112 via the control valve 105. After a suitable pressure (e.g., about 0.1 mTorr to about 10 Torr) is achieved in the plasma chamber 112, the controller 118 can output a signal to modulate the control valve 105 to maintain a generally constant pressure in the plasma chamber 112.

The controller 118 can then output a signal to energize the plasma power supply 104. The plasma power supply 104 then provides electrical power (e.g., an AC voltage) to the plasma source 111 to generate a plasma 126 in the plasma chamber 112. In the illustrated embodiment, the generated plasma includes an argon plasma that includes argon ions and electrons. In other embodiments, the generated plasma can include a nitrogen, a xenon, a helium, and/or other suitable types of plasma.

The controller 118 can also output a signal to energize the biasing power supply 106, which in turn biases the substrate support 113 and the microelectronic substrate 114. In one embodiment, the biasing power supply 106 applies a continuous or pulsed negative DC bias to the substrate support 113 and the microelectronic substrate 114 relative to ground. The resultant electric field is believed to drive positive argon ions to bombard the back surface 114b of the microelectronic substrate 114 (as indicated by the arrows 128) while forcing electrons away from the microelectronic substrate 114. In other embodiments, the biasing power supply 106 can apply a continuous or pulsed positive DC bias to the substrate support 113 and the microelectronic substrate 114 relative to ground.

Without being bound by theory, it is believed that as the argon ions (or electrons) bombard the back surface 114b of the microelectronic substrate 114, the argon ions (or electrons) can transfer their kinetic energy to thermal energy and thus raise the temperature of the microelectronic substrate 114. In certain embodiments, the ramp-up rates can be from about 300° C./second to about 900° C./second. In other embodiments, the ramp-up rates can be from about 500° C./second to about 850° C./second. In further embodiments, the ramp-up rates can be from about 600° C./second to about 800° C./second.

The following equations are believed to represent the ramp-up and ramp-down responses of the microelectronic substrate 114 when processed in the RTP system 100:

$$dT = \frac{P_{net}}{C} dt \quad \text{(Equation 1)}$$

where T is the substrate temperature, t is time, $P_{net}$ is the net input power, and C is the heat capacity of the microelectronic substrate 114.

During heating, the thermal losses by conduction and convection from the microelectronic substrate 114 may be negligible because the pressure in the plasma chamber 112 is low, so that the net input power can be represented as:

$$P_{net} = P_{in} - P_{rad} \quad \text{(Equation 2)}$$

where $P_{in}$ is an input power density and $P_{rad}$ is a power density by radiation. $P_{in}$ can be calculated as:

$$P_{in} = V_0 J \quad \text{(Equation 3)}$$

where $V_0$ is the bias voltage, J is a current density. $P_{rad}$ can be calculated by:

$$P_{rad} = 2 \cdot e \cdot \sigma \cdot (T^4 - T_0^4) \quad \text{(Equation 4)}$$

where e is the emissivity of the back surface 114b of the microelectronic substrate 114. The value of the emissivity can be between 0 to 1 depending on the temperature and material. $\sigma$ is the Stefan-Boltzmann constant and has a value of $5.68 \times 10^{-12}$ W/cm²-K⁴, T is the substrate temperature, and $T_0$ is an environment temperature (e.g., the temperature in the plasma chamber 112). Combining Equations (1) to (4), the temperature response of the microelectronic substrate 114 can be represented according to equation (5) below.

$$\frac{dT}{dt} = \frac{V_0 J - 2 \cdot e \cdot \sigma \cdot (T^4 - T_0^4)}{C} \quad \text{(Equation 5)}$$

In certain embodiments, the controller 118 can control the ramp-up and/or ramp-down rates of the microelectronic substrate 114 in a feed-forward fashion. For example, in one embodiment, the controller 118 can include a calculation module that calculates a value of the bias voltage $V_0$ by solving Equation 5 based on a desired value for the ramp-up rate $$\frac{dT}{dt}$$

and the current density J. The controller 118 can then set the output voltage of the biasing power supply 106 to be equal to or otherwise based on the calculated value. The controller 118 can also set the output voltage of the plasma power supply 104 to a value that corresponds to the desired current density J.

In other embodiments, the controller 118 can control the ramp-up and/or ramp-down rates of the microelectronic substrate 114 in a feedback fashion. For example, the temperature sensor 108 and/or other suitable sensing device (not shown) can measure a current value of the substrate temperature T and provide the measured value to the controller 118. In one embodiment, the controller 118 can then adjust the bias voltage $V_0$ and/or the output voltage of the plasma power supply 104 based on the current substrate temperature T to achieve a desired temperature setpoint in the microelectronic substrate 114. In another embodiment, the controller 118 can also control the pulse width of the pulsed DC bias to achieve the temperature setpoint when the biasing power supply 106 provides a pulsed DC bias to the substrate support 113. In other embodiments, the controller 118 can monitor the measured value of the substrate temperature T and derive a rate of change $\Delta T$ in the substrate temperature T. The controller 118 can then adjust the bias voltage $V_0$, the output voltage of the plasma power supply 104, and/or the pulse width of the biasing power supply 106 based on the rate of change $\Delta T$ in the substrate temperature T.

In yet other embodiments, the controller 118 can have cascaded control arrangements for achieving desired ramp-up and/or ramp-down rates of the microelectronic substrate 114. For example, the controller 118 can include a master control module logically coupled to a slave control module. The master and/or slave control module can include a proportional loop, a proportional-integral loop, a proportional-integral-differential loop, and/or other suitable control loops. The master control module can use the rate of change $\Delta T$ and/or other suitable parameters as the process variable. The slave control module can use the substrate temperature T as the process variable. The master control module can then produce a substrate temperature setpoint for the slave control module based on the rate of change $\Delta T$ and a desired rate of change setpoint. In further embodiments, the controller 118 can control the substrate temperature T, the rate of change $\Delta T$ in the substrate temperature T, and/or other process parameters based on a combination of the foregoing techniques.

After the desired temperature is achieved, in certain embodiments, the controller 118 can adjust the bias voltage $V_0$, the output voltage of the plasma power supply 104, and/or the pulse width of the biasing power supply 106 to maintain the microelectronic substrate 114 at the desired temperature for a predetermined time period (e.g., during a soak anneal operation). In other embodiments, the controller 118 can immediately turn off the plasma power supply 104 and the biasing power supply 106 to start cooling the microelectronic substrate 114 (e.g., during a spike anneal operation).

In certain embodiments, the microelectronic substrate 114 can be cooled by radiation only. For example, the microelectronic substrate 114 can remain in the plasma chamber 112 after the plasma power supply 104 and the biasing power supply 106 are turned off. The microelectronic substrate 114 can also be removed from the plasma chamber 112. The controller 118 can continue monitoring the current substrate temperature T via the temperature sensor 108 until a desired temperature is achieved. In certain embodiments, the ramp-down rates can be from about 100° C./second to about 200° C./second. In other embodiments, the ramp-down rates can be from about 120° C./second to about 150° C./second.

In other embodiments, the microelectronic substrate 114 can be actively cooled. For example, in the illustrated embodiment, the substrate support 113 can transport the microelectronic substrate 114 from the plasma chamber 112 to the cooling chamber 110. The cooling chucks 119 can then absorb heat from the microelectronic substrate 114 via conduction to achieve the desired temperature. In further embodiments, the microelectronic substrate 114 can also be cooled with a combination of conduction, convection, and radiation techniques. When actively cooled, the ramp-down rates can range from about 1000° C./second to about 2000° C./second.

After the microelectronic substrate 114 is cooled to the desired temperature, in certain embodiments, the microelectronic substrate 114 may be removed from the plasma chamber 112. A new microelectronic substrate 114 may be loaded into the plasma chamber 112, and the foregoing thermal processing operations may be repeated. In other embodiments, the microelectronic substrate 114 may undergo the foregoing treatment again as needed.

Even though the biasing power supply 106 and/or the plasma power supply 104 are utilized in the RTP system 100 of FIG. 1 to impart energy to the generated plasma 126, in other embodiments, the RTP system 100 may impart energy to the plasma 126 with other components and/or techniques in addition to or in lieu of the biasing power supply 106 and/or the plasma power supply 104. For example, in certain embodiments, radio frequency waves may be used to impart energy to the plasma 126. In other embodiments, the RTP system 100 may include other suitable energy delivery components.

Figure 2:
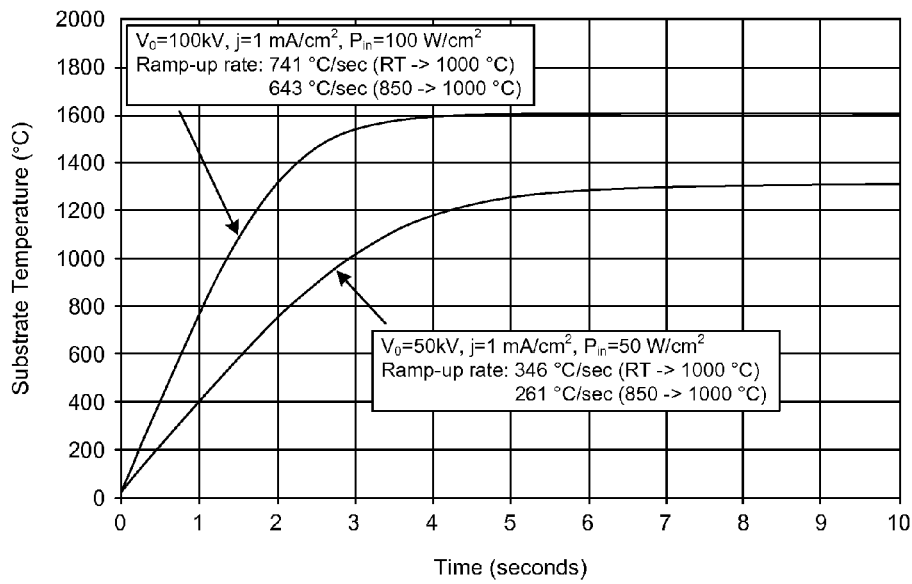
FIG. 2 is a plot of substrate temperature versus time for a microelectronic substrate treated in the RTP system of FIG. 1 in accordance with embodiments of the disclosure.
Figure 3:
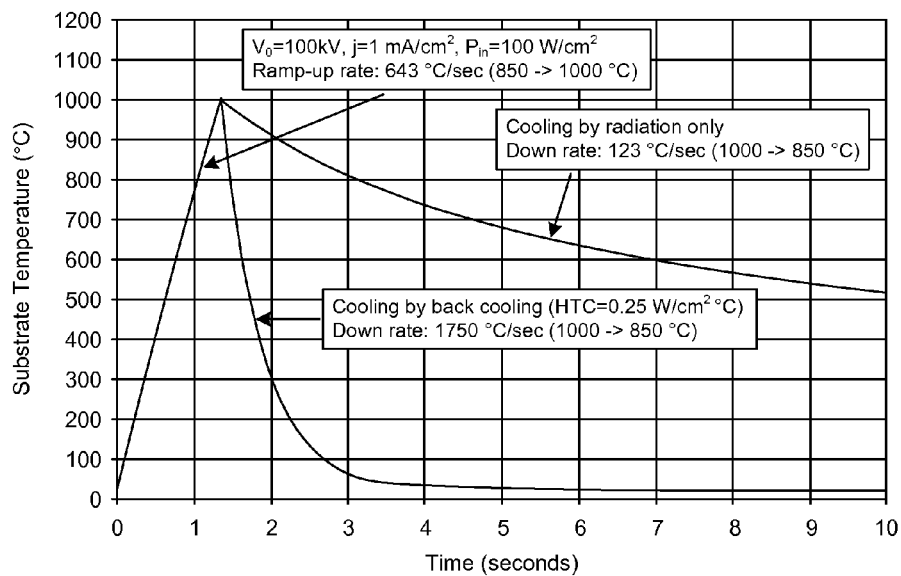
FIG. 3 is a plot of substrate temperature versus time for a microelectronic substrate during a spike anneal operation in the RTP system of FIG. 1 in accordance with embodiments of the disclosure.

FIGS. 2 and 3 show examples of temperature responses under certain operating conditions in the RTP system 100 when the controller 118 controls the ramp-up and/or ramp-down rates of the microelectronic substrate 114 in a feed-forward fashion. As shown in FIG. 2, at an input power density $P_{in}$ of about 100 W/cm$^2$ with e having a value of 0.7, the substrate temperature T increases from room temperature (RT) to about 1000° C. in about 1.35 seconds. The ramp-up rate is about 741° C./second from RT to about 1000° C., and about 643° C./second from 850° C. to 1000° C. Such ramp-up rates are much higher than those of the conventional RTP techniques, which are typically about 25° C./second to about 100° C./second.

FIG. 3 is a plot of substrate temperature versus time for a microelectronic substrate during a spike anneal operation in the RTP system of FIG. 1 when the input power density $P_{in}$ is 100 W/cm$^2$. As shown in FIG. 3, the ramp-up rate is about 741° C./second from RT to about 1000° C., and about 643° C./second from about 850° C. to about 1000° C. The ramp-down rate is about 123° C./second from 1000° C. to 850° C. by radiation only, but it is about 1750° C./second from 1000° C. to 850° C. using an active cooling technique (e.g., via a direct contact with the cooling chucks 119 or backside gas cooling with a heat transfer coefficient of about 0.25 W/cm$^{2\circ}$C.). These ramp-down rates are much higher than those of the conventional RTP techniques, which are typically about 48° C./second.

Several embodiments of the RTP system 100 can have a thermal budget much lower than that of the conventional lamp-based or hot wall-based RTP systems. For example, in a spike anneal (e.g., heating from about 850° C. to about 1000° C. and subsequently cooling back down to about 850° C.), several embodiments of the RTP system 100 can have a thermal budget of 1.5 seconds by natural cooling or 0.34 seconds by active cooling, as shown in FIG. 3. These thermal budget values are much lower than those of the conventional lamp-based or hot wall-based RTP techniques (i.e., typically about 6 seconds or more), yet they are sufficiently long to avoid rapidly quenching the microelectronic substrate 114 in a manner that produces lattice defects or other problems associated with existing flash lamp-based and pulsed laser-based RTP techniques.

Several embodiments of the RTP system 100 can have higher energy conversion efficiency than conventional RTP systems. Without being bound by theory, it is believed that the kinetic to thermal energy conversion in several embodiments of the RTP system 100 is very high (i.e., approximately 100%), even at lower temperatures. Thus, for the spike anneal process shown in FIG. 3, the total process time starting from room temperature is less than 10 seconds, which is much shorter than that of the conventional lamp-based or hot wall-based RTP systems (e.g., about 50 seconds).

Figure 4:
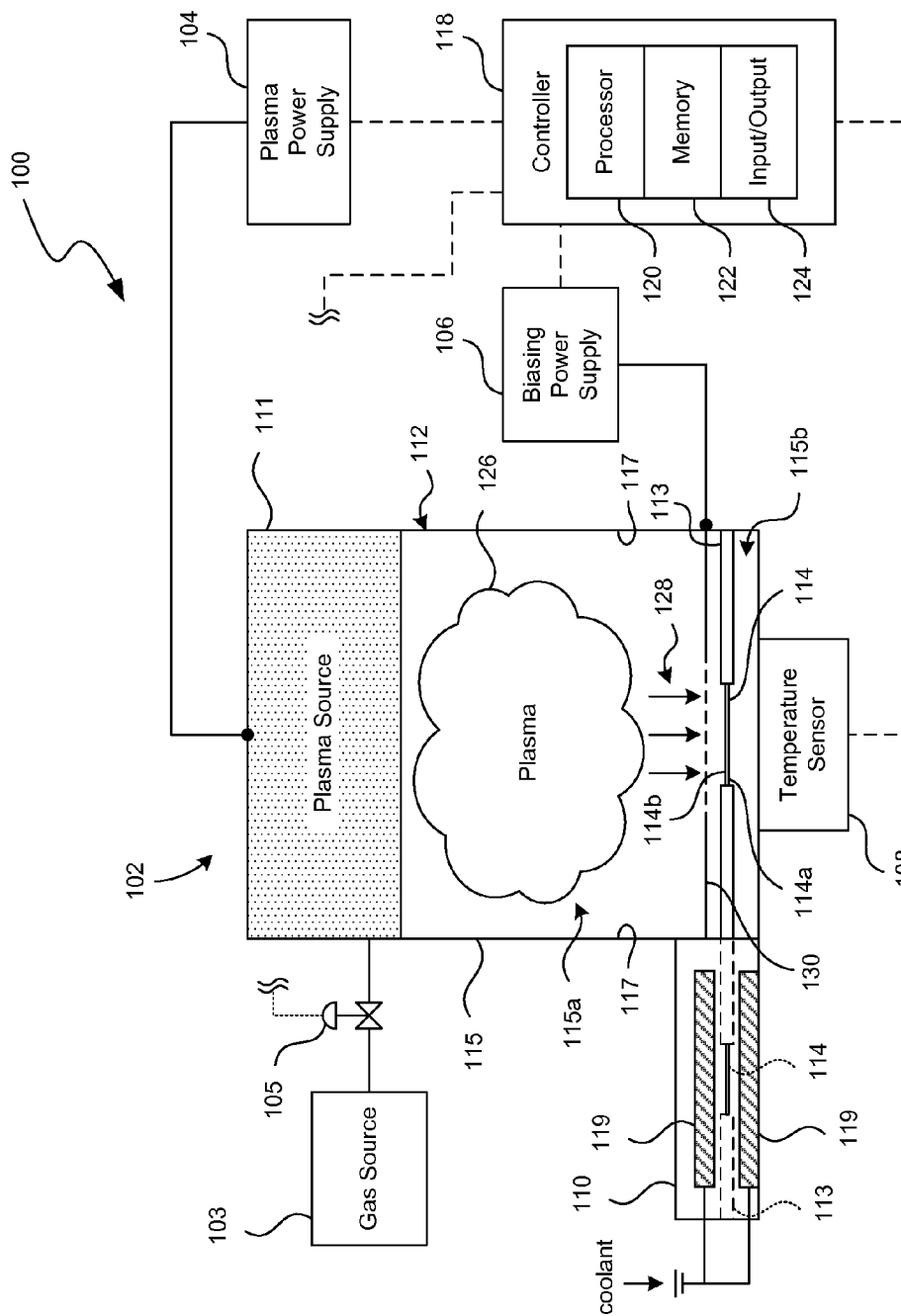
FIG. 4 is a schematic view of a plasma-immersion type RTP system in accordance with another embodiment of the disclosure.

FIG. 4 schematically shows another embodiment of the RTP system 100. Even though the biasing power supply 106 shown in FIG. 1 is configured to directly bias the substrate support 113, the processing station 102 of the RTP system 100 shown in FIG. 4 can also bias a plasma electrode 130 (e.g., a perforated grid) positioned proximate to the substrate support 113. The plasma electrode 130 shown in FIG. 4 can be used in lieu of directly biasing the substrate support 113. The resultant electric field is believed to drive at least a portion of the ions from the plasma 126 to bombard the back surface 114b of the microelectronic substrate 114 via the plasma electrode 130.

Figure 5:
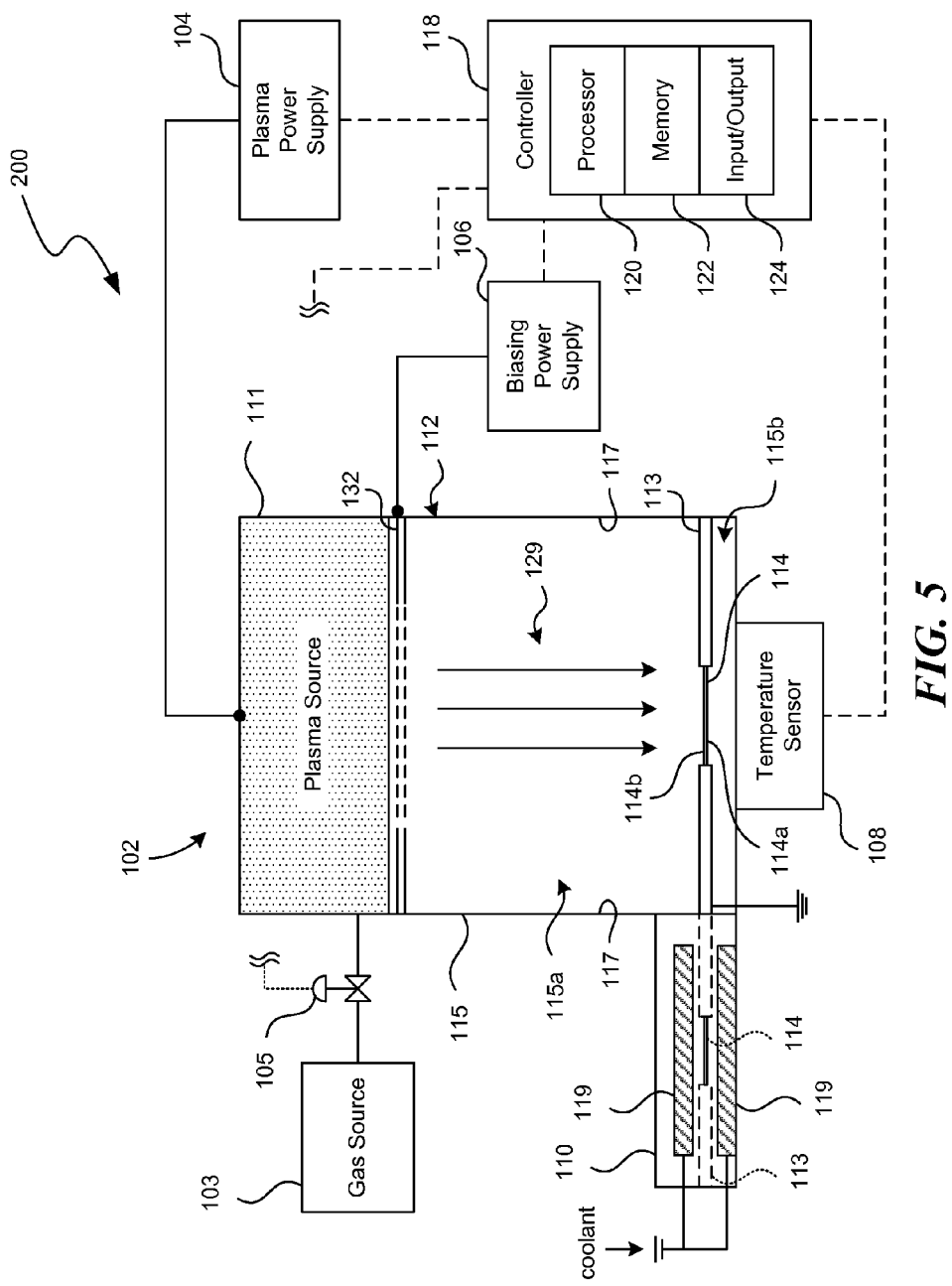
FIG. 5 is a schematic view of an ion-shower type RTP system in accordance with another embodiment of the disclosure.

In further embodiments, the RTP system 100 can also include other ion extraction arrangements. For example, FIG. 5 is a schematic view of an ion-shower type RTP system 200 in accordance with another embodiment of the disclosure. As shown in FIG. 5, the processing station 102 can include an ion extraction electrode 132 positioned proximate to the plasma source 111. The ion extraction electrode 132 can include at least one perforated plate that is electrically coupled to the biasing power supply 106. In operation, the biasing power supply 106 electrically biases the ion extraction electrode 132 to extract, accelerate, and/or focus beams of ions (as indicated by the arrows 129) from the plasma source 111 onto the microelectronic substrate 114 on the substrate support 113.

Figure 6:
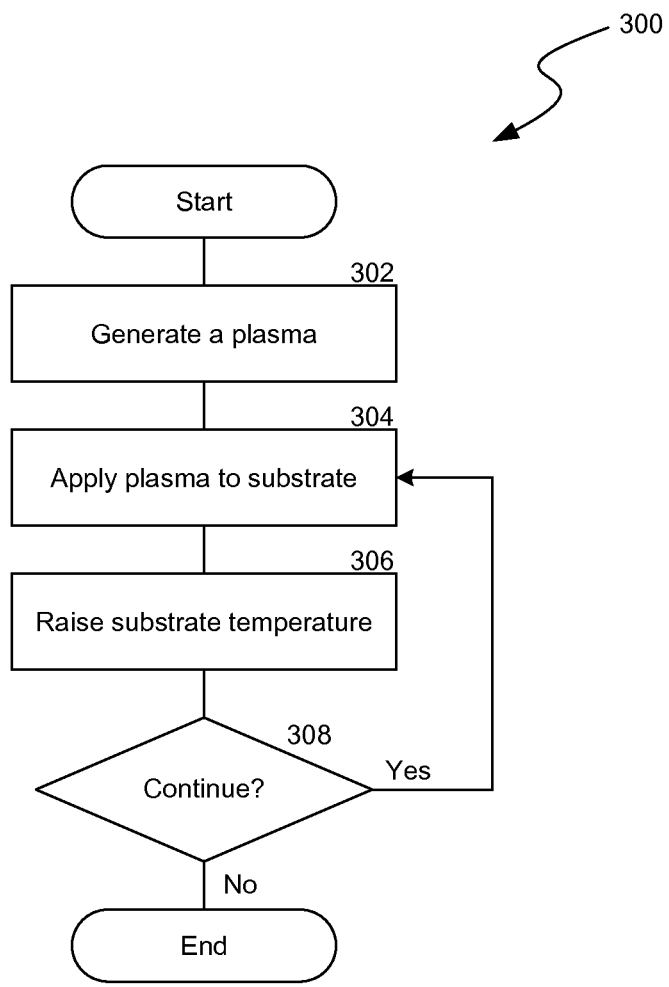
FIG. 6 is a flowchart showing a method for thermally processing a microelectronic substrate in accordance with embodiments of the disclosure.

FIG. 6 is a flowchart showing a method 300 for thermally processing a microelectronic substrate in accordance with embodiments of the disclosure. As shown in FIG. 6, the method 300 includes generating a plasma (block 302). In certain embodiments, generating the plasma can include generating an argon, oxygen, nitrogen, xenon, helium, and/or other suitable type of plasma from an inductively coupled plasma source, a capacitively coupled plasma source, a microwave plasma source, an electron cyclotron resonance plasma source, a helicon source, and/or another suitable plasma source. In other embodiments, generating the plasma can include transporting the plasma from an external and/or other suitable plasma source.

The method 300 can include applying the generated plasma to a microelectronic substrate (block 304). In one embodiment, applying the generated plasma includes driving at least a portion of the plasma toward the microelectronic substrate by electrically biasing the microelectronic substrate. In another embodiment, applying the generated plasma includes increasing the kinetic energy of at least a portion of the plasma and driving the portion of the plasma toward the microelectronic substrate. In other embodiments, applying the generated plasma includes extracting, accelerating, and/or focusing certain ions of the generated plasma onto the microelectronic substrate. The plasma can be applied for heating purposes only without directly interfacing with the active side of the substrate by applying the plasma against the backside of the substrate opposite the active side.

The method 300 can also include raising a temperature of the microelectronic substrate with the applied plasma to a desired temperature setpoint (block 306). In one embodiment, raising the temperature of the microelectronic substrate includes completely converting at least part of the kinetic energy of the applied plasma into thermal energy. In other embodiments, raising the temperature of the microelectronic substrate can also include converting the kinetic and/or other types of energy of the applied plasma into thermal energy via fiction, electrical interaction, and/or other suitable mechanisms.

In certain embodiments, raising the temperature of the microelectronic substrate can also include controlling the energy of the applied plasma (block 306). In one embodiment, controlling the energy of the applied plasma includes adjusting a driving force (e.g., an electrical bias voltage, a pulse width of a pulsed DC bias voltage, etc.) of the plasma toward the microelectronic substrate. In another embodiment, controlling the energy of the applied plasma includes measuring a current temperature of the microelectronic substrate and adjusting the driving force based at least in part on the measured current temperature. In further embodiments, controlling the energy of the applied plasma can also include controlling an ion density of the plasma and/or other suitable parameters. The method 300 then continues to a decision stage (block 308) to determine whether the process should continue. If yes, the process reverts to the stage of applying the plasma to the microelectronic substrate at block 304; otherwise, the process ends.

Experiments were conducted in an RTP system generally similar in structure and function to that of the RTP system 200 of FIG. 5. Oxygen was used as the plasma gas to produce an oxygen plasma. A biasing voltage of 50 keV and an ion current density of about 5 mA/cm² were used to drive the oxygen plasma into a silicon wafer with a 300 mm diameter. The wafer temperature was raised from RT to about 1000° C. in about 2 seconds as measured by an IR pyrometer.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A rapid thermal processing system for treating a microelectronic substrate, comprising:
   a plasma chamber;
   a plasma source in fluid communication with the plasma chamber, the plasma source being configured to generate a plasma;
   a plasma power supply coupled to the plasma source, the plasma power supply configured to provide a plasma voltage to the plasma source;
   a substrate support in the plasma chamber, the substrate support being configured to support the microelectronic substrate;
   a biasing power supply electrically coupled to the substrate support, the biasing power supply configured to provide a biasing voltage to the microelectronic substrate; and
   a controller operatively coupled to the plasma source and the biasing power supply, the controller having a computer readable medium containing instructions for performing a method comprising adjusting at least one of the plasma voltage or the biasing voltage based on a desired temperature of the microelectronic substrate.

2. The rapid thermal processing system of claim 1 wherein adjusting at least one of the plasma source and the biasing power supply includes adjusting at least one of the plasma source and the biasing power supply and achieving the desired temperature in the microelectronic substrate at a ramp-up rate of about 300° C./second to about 800° C./second.

3. The rapid thermal processing system of claim 1, further comprising:
   a temperature sensor proximate to the plasma chamber and operatively coupled to the controller, the temperature sensor being configured to measure a current temperature of the microelectronic substrate; and
   wherein adjusting at least one of the plasma source and the biasing power supply includes adjusting at least one of the plasma source and the biasing power supply based on the measured current temperature of the microelectronic substrate and achieving the desired temperature in the microelectronic substrate.

4. The rapid thermal processing system of claim 1, further comprising:
   a plasma power supply electrically coupled to the plasma source;
   a temperature sensor proximate to the plasma chamber and operatively coupled to the controller, the temperature sensor being configured to measure a current temperature of the microelectronic substrate; and
   wherein adjusting at least one of the plasma source and the biasing power supply includes adjusting at least one of an output voltage of the plasma power supply and an output voltage of the biasing power supply based on the measured current temperature of the microelectronic substrate and achieving the desired temperature in the microelectronic substrate.

5. The rapid thermal processing system of claim 1, further comprising:
   a temperature sensor proximate to the plasma chamber and operatively coupled to the controller, the temperature sensor being configured to measure a current temperature of the microelectronic substrate; and
   wherein the substrate support includes a generally ring-shaped structure that sealably separates the plasma chamber into a first portion proximate to the plasma source and a second portion proximate to the temperature sensor, the generated plasma being shielded from the second portion of the plasma chamber.

6. The rapid thermal processing system of claim 1 wherein the system does not include a means for actively cooling the microelectronic substrate while positioned on the substrate support.

7. The rapid thermal processing system of claim 1, further comprising a plasma electrode positioned between the plasma source and the microelectronic substrate.

8. The rapid thermal processing system of claim 1, further comprising an extraction electrode positioned between the plasma source and the microelectronic substrate.

9. The rapid thermal processing system of claim 1 wherein the biasing power supply is configured to supply a pulsed D.C. voltage to the microelectronic substrate.

10. The rapid thermal processing system of claim 1 wherein the biasing power supply is configured to negatively bias the microelectronic substrate.

11. A rapid thermal processing system for treating a microelectronic substrate, comprising:
   a plasma chamber;
   a plasma source coupled to the plasma chamber, the plasma source being configured to generate a plasma in the plasma chamber;
   a substrate support in the plasma chamber, the substrate support being configured to support the microelectronic substrate; and
   a biasing power supply electrically coupled to the substrate support, the biasing power supply configured to bias the microelectronic substrate to indirectly raise a temperature of the microelectronic substrate with the generated plasma at a rate of about 300° C./second to about 800° C./second.

12. The rapid thermal processing system of claim 11, further comprising means for controlling the imparted energy to the generated plasma based on the rate of about 300° C./second to about 800° C./second.

13. The rapid thermal processing system of claim 11, further comprising:
   a temperature sensor proximate to the plasma chamber, the temperature sensor being configured to measure a current temperature of the microelectronic substrate; and
   means for controlling the imparted energy to the generated plasma based at least in part on the measured current temperature of the microelectronic substrate and a ramp-up rate of about 300° C./second to about 800° C./second.

14. The rapid thermal processing system of claim 11 wherein the biasing power supply is configured to supply a pulsed D.C. voltage to the microelectronic substrate.

15. The rapid thermal processing system of claim 11 wherein the biasing power supply is configured to negatively bias the microelectronic substrate.

* * * * *